US009035444B2

(12) United States Patent
Sato

(10) Patent No.: US 9,035,444 B2
(45) Date of Patent: May 19, 2015

(54) SEMICONDUCTOR DEVICE HAVING PENETRATION ELECTRODES PENETRATING THROUGH SEMICONDUCTOR CHIP

(75) Inventor: Homare Sato, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/493,578

(22) Filed: Jun. 11, 2012

(65) Prior Publication Data

US 2012/0319757 A1 Dec. 20, 2012

(30) Foreign Application Priority Data

Jun. 14, 2011 (JP) ................................. 2011-132017

(51) Int. Cl.
| | |
|---|---|
| *H01L 23/02* | (2006.01) |
| *H01L 25/065* | (2006.01) |
| *H01L 23/48* | (2006.01) |

(52) U.S. Cl.
CPC ..... *H01L 25/0657* (2013.01); *H01L 2924/1532* (2013.01); *H01L 2225/06541* (2013.01); *H01L 2225/06544* (2013.01); *H01L 23/481* (2013.01); *H01L 2224/16145* (2013.01)

(58) Field of Classification Search
CPC .............................................. H01L 2924/1532
USPC ................................................ 257/777, 686
See application file for complete search history.

(56) References Cited

U.S. PATENT DOCUMENTS

| | | | |
|---|---|---|---|
| 5,585,676 A | 12/1996 | Uda et al. | |
| 6,239,495 B1 * | 5/2001 | Sakui et al. | ................... 257/777 |
| 6,624,506 B2 * | 9/2003 | Sasaki et al. | .................. 257/686 |
| 7,327,590 B2 * | 2/2008 | Matsui et al. | .................... 365/51 |
| 7,489,030 B2 | 2/2009 | Shibata et al. | |
| 7,732,328 B2 * | 6/2010 | Kwon et al. | .................. 438/667 |
| 7,745,919 B2 | 6/2010 | Shibata et al. | |
| 7,939,947 B2 * | 5/2011 | Kwon et al. | .................. 257/777 |
| 7,952,201 B2 * | 5/2011 | Shibata et al. | ................. 257/773 |
| 7,999,367 B2 * | 8/2011 | Kang et al. | ..................... 257/686 |

(Continued)

FOREIGN PATENT DOCUMENTS

| | | |
|---|---|---|
| JP | 2006-313607 A | 11/2006 |
| JP | 2007-158237 A | 6/2007 |
| WO | WO 2007/032184 A1 | 3/2007 |

*Primary Examiner* — Ajay K Arora

(57) ABSTRACT

Disclosed herein is a semiconductor device that includes: a first circuit formed on a chip having a main surface; first to $n^{th}$ penetration electrodes penetrating through the chip, where n is an integer more than 1; first to $n^{th}$ main terminals arranged on the main surface of the chip and vertically aligned with the first to $n^{th}$ penetration electrodes, respectively, each of $k^{th}$ main terminal being electrically connected to $k+1^{th}$ penetration electrode, where k is an integer more than 0 and smaller than n, and the $n^{th}$ main terminal being electrically connected to the first penetration electrode; a sub-terminal arranged on the main surface of the chip; and a selection circuit electrically connected to predetermined one of the first to $n^{th}$ main terminals, the sub-terminal, and the first circuit, wherein the selection circuit connects the first circuit to one of the predetermined main terminal and the sub-terminal.

17 Claims, 16 Drawing Sheets

(56) References Cited

U.S. PATENT DOCUMENTS

| | | | |
|---|---|---|---|
| 8,076,764 B2* | 12/2011 | Yamada et al. | 257/686 |
| 8,238,134 B2* | 8/2012 | Matsui et al. | 365/63 |
| 8,278,766 B2* | 10/2012 | Lee et al. | 257/777 |
| 2002/0109236 A1 | 8/2002 | Kim et al. | |
| 2003/0026135 A1* | 2/2003 | Hill et al. | 365/189.02 |
| 2004/0177298 A1* | 9/2004 | Farnworth et al. | 714/724 |
| 2005/0001306 A1* | 1/2005 | Matsuo et al. | 257/686 |
| 2005/0139978 A1* | 6/2005 | Hirose | 257/686 |
| 2009/0039492 A1* | 2/2009 | Kang et al. | 257/686 |
| 2009/0102503 A1* | 4/2009 | Saito | 324/765 |
| 2011/0050320 A1* | 3/2011 | Gillingham | 327/365 |
| 2011/0201154 A1 | 8/2011 | Shibata et al. | |

* cited by examiner

SEMICONDUCTOR DEVICE HAVING PENETRATION ELECTRODES PENETRATING THROUGH SEMICONDUCTOR CHIP

This application claims benefit of priority from Japanese patent application no. 2011-132017, filed Jun. 14, 2012, the entire contents of which is incorporated herein by reference.

BACKGROUND OF THE INVENTION

1. Field of the Invention

The present invention relates to a semiconductor device, and particularly relates to a semiconductor device having a plurality of stacked semiconductor chips electrically connected to one another by penetration electrodes that penetrating through the semiconductor chips.

2. Description of Related Art

The storage capacity required for a semiconductor memory device such as a DRAM (Dynamic Random Access Memory) is increasing in recent years. To meet this demand, there is recently proposed a memory device called "multi-chip package" in which a plurality of memory chips are stacked. However, because of the need to provide wires connecting the respective memory chips to a package substrate, it is difficult to stack many memory chips in the multi-chip package.

On the other hand, there is recently proposed a semiconductor device of such a type that a plurality of memory chips each provided with penetration electrodes are stacked. The penetration electrodes may be referred to as through silicon vias. In the semiconductor device of this type, the through silicon vias provided in each of the memory chips are connected to those provided in upper and lower memory chips. Accordingly, the number of through silicon vias connected to the package substrate does not increase even if the number of stacks increases. Therefore, it is possible to stack more memory chips (see Japanese Patent Application Laid-open Nos. 2006-313607 and 2007-158237, and International Publication No. WO2007/032184).

In the stacked semiconductor device, the through silicon vias provided at the same plane position as viewed from a stacking direction, are basically short-circuited. However, as described in Japanese Patent Application Laid-open No. 2006-313607, a part of the through silicon vias are not short-circuited and those arranged at different plane positions, as viewed from the stacking direction, are often connected to one another. Such through silicon vias are used to apply different signals to the respective semiconductor chips.

On the other hand, because many through silicon vias are provided in the semiconductor chips, a part of the through silicon vias often becomes defective and the defective through silicon vias need to be relieved by being replaced by auxiliary through silicon vias. Specifically, as described in Japanese Patent Application Laid-open No. 2007-158237, there is proposed a method of connecting a plurality of through silicon vias in parallel in advance or making regular through silicon vias replaceable by auxiliary through silicon vias. Furthermore, International Publication No. WO2007/032184 describes a method of commonly allocating an auxiliary through silicon via to a plurality of through silicon vias.

With the method of connecting the through silicon vias in parallel, if any of the through silicon vias has a non-conductive defect, it is possible to relieve the through silicon via. However, it is impossible to relieve the through silicon via if the through silicon via has a short-circuit defect (short-circuit to a power supply line or another through silicon via). Furthermore, the large increase in the number of necessary through silicon vias causes not only the increase in an occupation area of the through silicon vias on each of the chips but also the increase in the load of the through silicon vias as a result of the parallel connection of the through silicon vias. Therefore, there is a problem that it is required to improve the capability of a driver for driving these through silicon vias.

With the method of replacing the regular through silicon via by the auxiliary through silicon via, it is necessary for each through silicon via to include a switching circuit, which results in the increase in the occupation area of the through silicon vias on each chip. Particularly on a signal path on which the through silicon vias that are arranged at the different plane positions, as viewed from the stacking direction, are short-circuited, each through silicon via is used only to supply signals to one corresponding semiconductor chip and does not contribute to supplying signals to the other semiconductor chips. Therefore, it is inefficient to provide the switching circuits in all of these through silicon vias, respectively.

SUMMARY

In one embodiment, there is provided a semiconductor device that includes: a first circuit formed on a first chip having a main surface; first to $n^{th}$ penetration electrodes penetrating through the first chip, where n is an integer more than 1; first to $n^{th}$ main terminals arranged on the main surface of the first chip and vertically aligned with the first to $n^{th}$ penetration electrodes, respectively, each of $k^{th}$ main terminal being electrically connected to $k+1^{th}$ penetration electrode, where k is an integer more than 0 and smaller than n, and the $n^{th}$ main terminal being electrically connected to the first penetration electrode; a sub-terminal arranged on the main surface of the first chip; and a selection circuit electrically connected to predetermined one of the first to $n^{th}$ main terminals, the sub-terminal, and the first circuit, wherein the selection circuit connects the first circuit to one of the predetermined main terminal and the sub-terminal.

In another embodiment, there is provided a semiconductor device that includes: a third semiconductor chip stacked on the second semiconductor chips such that the second semiconductor chips are sandwiched between the first and third semiconductor chips; and a third signal path connecting the first semiconductor chip to the third semiconductor chip, the third signal path being formed by respective ones of the first penetration electrodes. The second signal path connects the first semiconductor chip to the second and third semiconductor chips in common. The switching circuit replaces one of the first and third signal paths by the second signal path.

BRIEF DESCRIPTION OF THE DRAWINGS

FIG. 15 is a circuit diagram indicative of an embodiment of a switching circuit 110a; and FIG. 16 is a circuit diagram of indicative of an embodiment of the switching circuit 150a.

DETAILED DESCRIPTION OF THE EMBODIMENTS

Preferred embodiments of the present invention will be explained below in detail with reference to the accompanying drawings.

Figure 1:
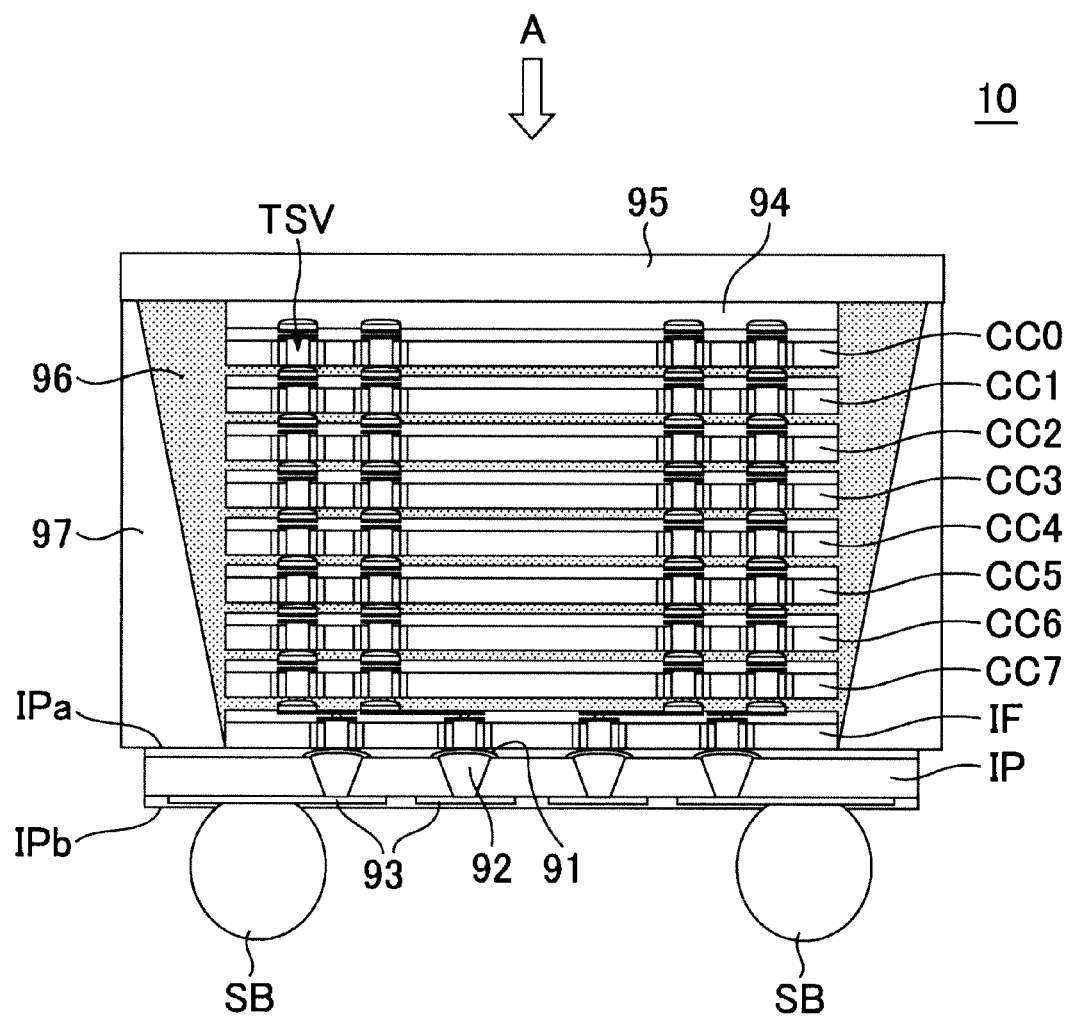
FIG. 1 is a schematic cross-sectional view for explaining a structure of a semiconductor device 10 according to a proffered first embodiment of the present invention.

Referring now to FIG. 1, the semiconductor device 10 according to this embodiment has the structure where eight core chips (memory chips) CC0 to CC7 and an interface chip IF are stacked on an interposer IP. The core chips CC0 to CC7 have the same function and structure as one another. It is worth noting that the uppermost core chip CC0 may have a different structure from the other core chips CC1 to CC7. For example, the uppermost core chip CC0 may be thicker than the remaining core chips CC1 to CC7. The core chips CC0 to CC7 are manufactured using the same manufacture mask whereas the interface chip IF is manufactured using a manufacture mask different from that of the core chips CC0 to CC7. The core chips CC0 to CC7 and the interface chip IF are semiconductor chips using a silicon substrate and are electrically connected to adjacent chips in a vertical direction through plural Through Silicon Vias (TSV) penetrating the silicon substrate. The through silicon via may be referred to as a penetration electrode. The uppermost core chip CC0 may not have the through silicon via TSV. Meanwhile, the interposer IP is a circuit board that is made of a resin, and plural external terminals (solder balls) SB are formed in a back surface IPb of the interposer IP.

The core chips CC0 to CC7 are semiconductor chips from which a so-called front-end portion, which performs an interface with an outside, of circuit blocks included in a normal stand-alone SDRAM (Synchronous Dynamic Random Access Memory), is removed. That is, each of the core chips CC0 to CC7 is a memory chip where only the circuit blocks belonging to the back end unit are integrated in principle. As the circuit blocks that are included in the front end unit, a parallel-serial converting circuit that performs parallel/serial conversion on input/output data between a memory cell array and a data input/output terminal and a DLL (Delay Locked Loop) circuit that controls input/output timing of data are exemplified, which will be described in detail below.

On the other hand, the interface chip IF is a semiconductor chip on which only the front-end portion of the circuit blocks included in the normal stand-alone SDRAM is integrated. The interface chip IF functions as a front-end portion common to 8 core chips CC0 to CC7. Accordingly, all of the external accesses are made through the interface chip IF, and data input and data output are made through the interface chip IF.

In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
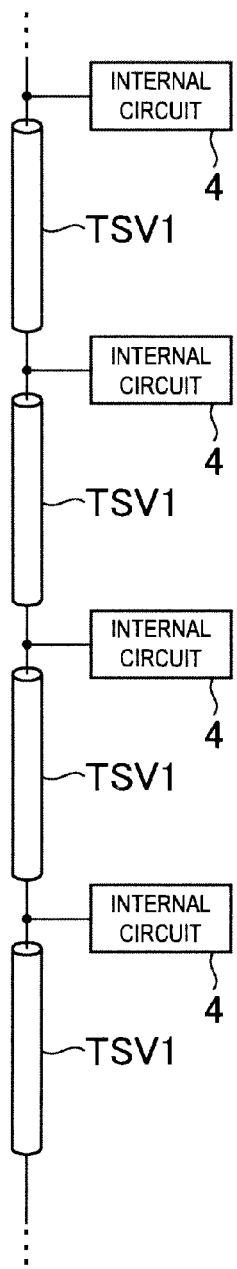
FIGS. 2A to 2C are diagrams indicative of an embodiment of various types of through silicon via TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Figure 2B:
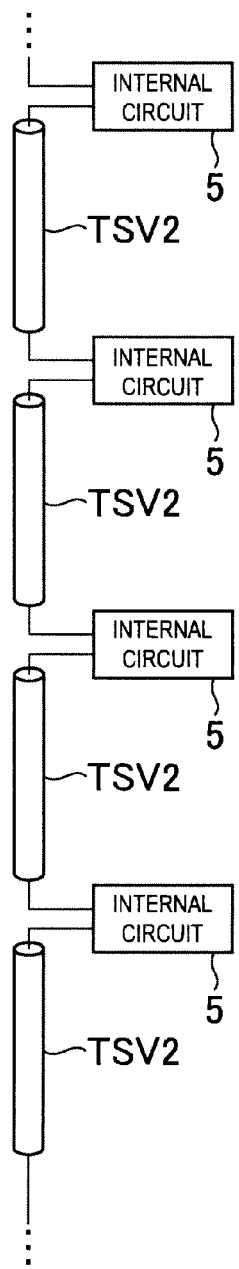

Meanwhile, as shown in FIG. 2B, a part of the through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, chip address information.

Figure 2C:
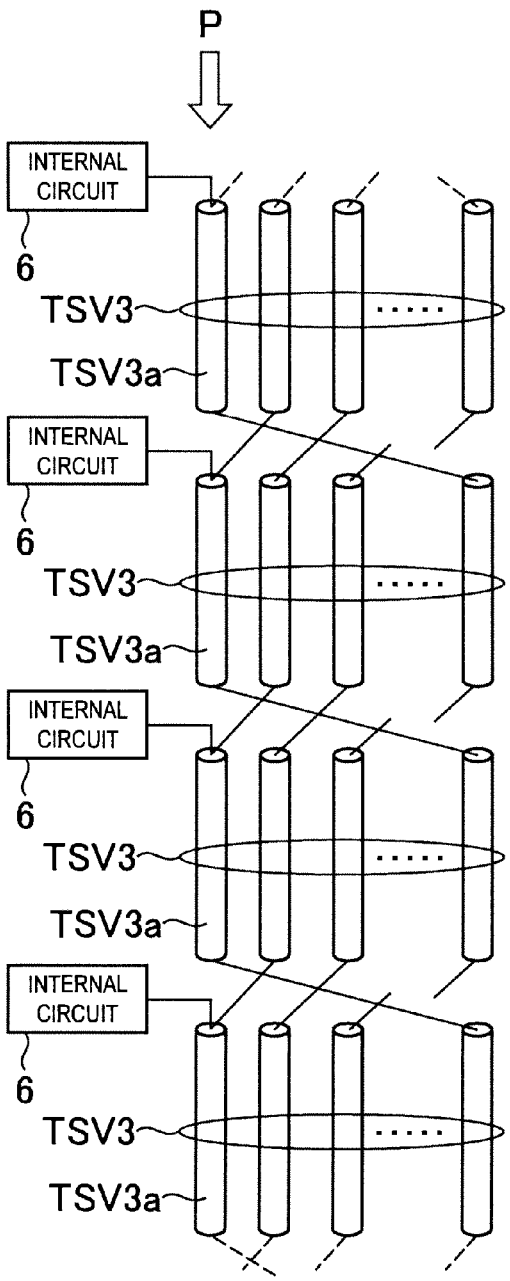

Another part of the through silicon vias TSV is short-circuited from the through silicon vias TSV of other layer provided at the different position in plan view, as shown in FIG. 2C. With respect to this kind of through silicon vias TSV group 3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified. By using the through silicon vias TSV3, it is also possible to supply information individually from each of the core chips CC0 to CC7 to the interface chip IF.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal and a command signal, and the like are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon vias TSV2 and TSV3 of the types shown in FIGS. 2B and 2C are used to provide individual information to the core chips CC0 to CC7 having the same structure.

Figure 3:
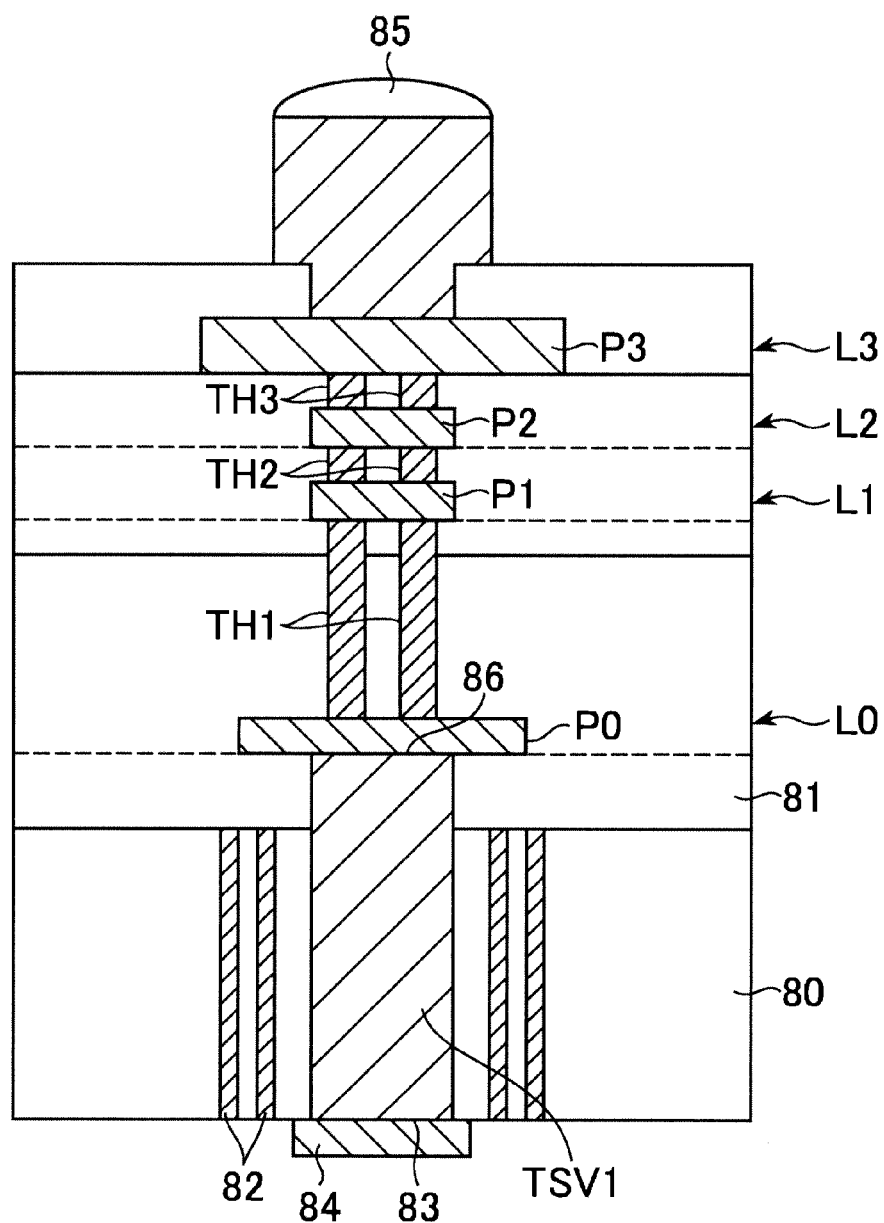
FIG. 3 is a cross-sectional view indicative of an embodiment of a structure of the through silicon via TSV1 of the type shown in FIG. 2A.

Turning to FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
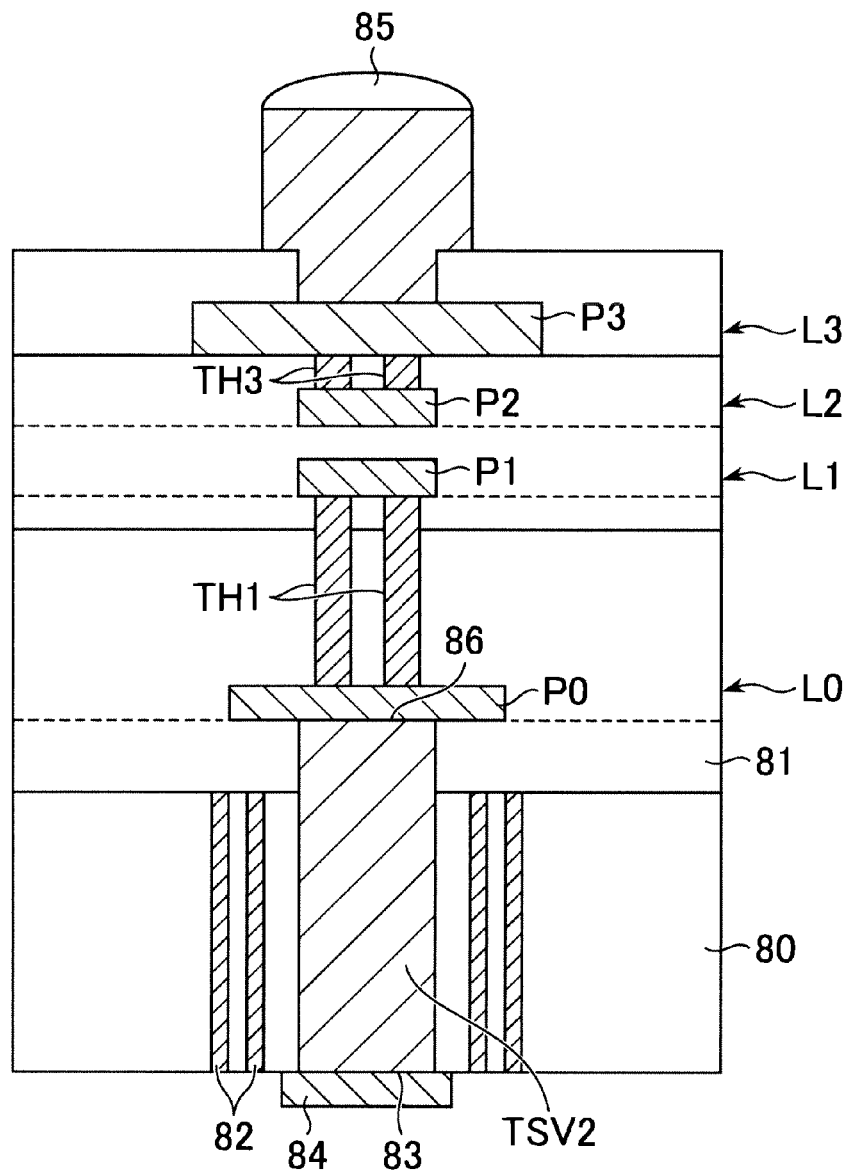
FIG. 4 is a cross-sectional view indicative of an embodiment of a structure of the through silicon via TSV2 of the type shown in FIG. 2B.

Turning to FIG. 4, the through silicon via TSV2 is different from the through silicon via TSV1 shown in FIG. 3 in that the through hole electrodes TH2 that directly connect the pads P1 and P2 located at the same plan position to each other are deleted. The pad P1 is connected to, for example, an output node of the internal circuit 5 shown in FIG. 2, and the pad P2 is connected to, for example, an input node of the internal circuit 5 shown in FIG. 2. This causes the respective internal circuits 5 provided in the core chips CC0 to CC7 to be cascaded through the through silicon vias TSV2.

Figure 5:
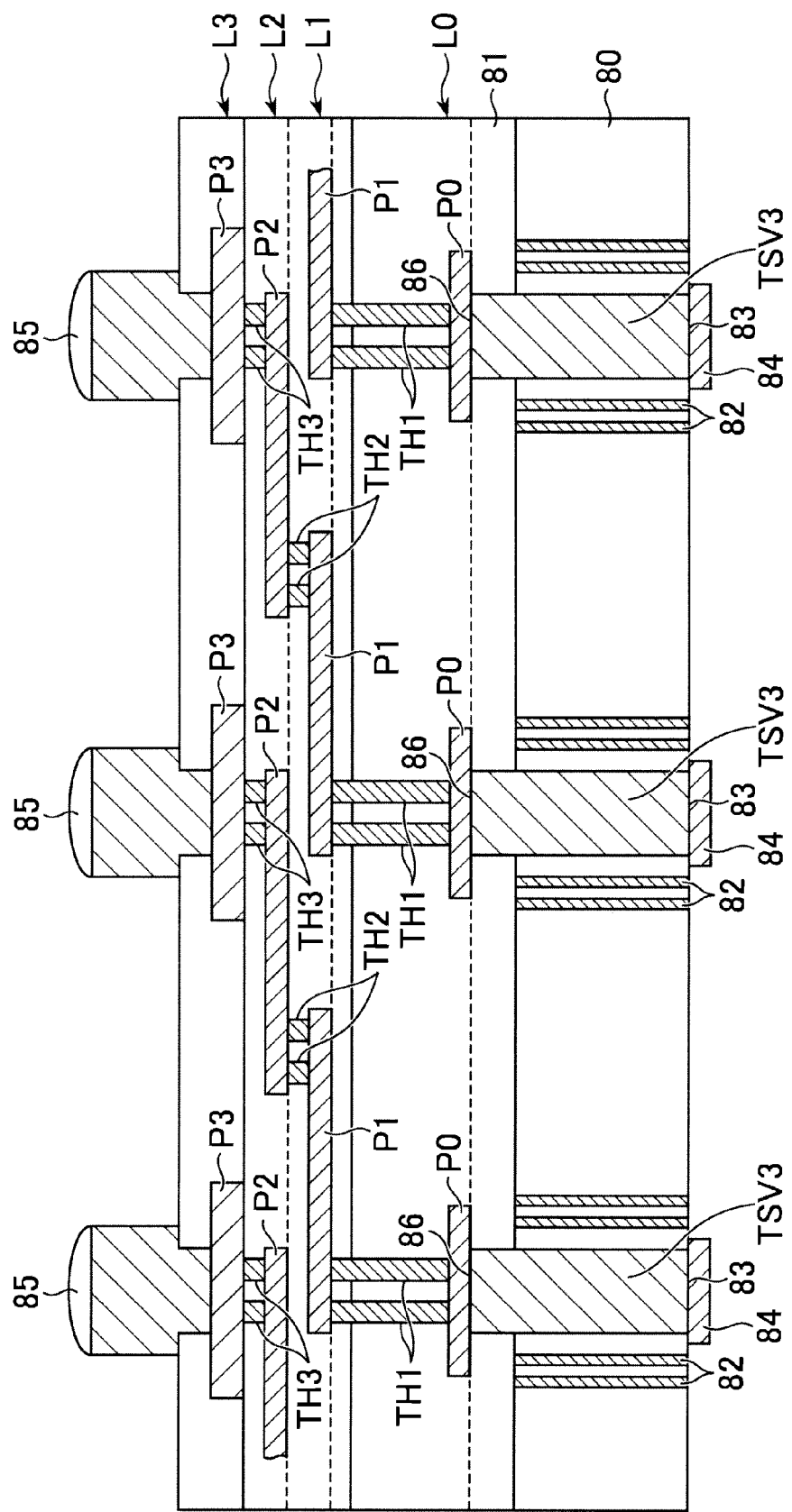
FIG. 5 is a cross-sectional view indicative of an embodiment of a structure of the through silicon via TSV3 of the type shown in FIG. 2C.
Figure 6:
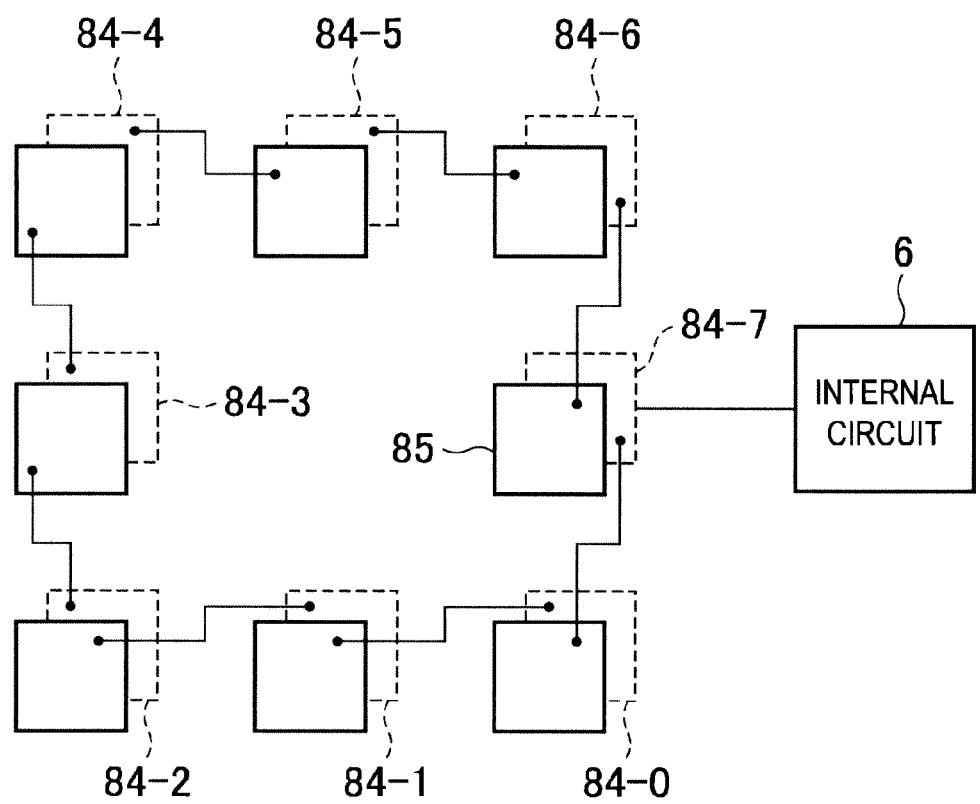
FIG. 6 is a schematic diagram for explaining a connection relation between through silicon vias TSV3 in respective core chips.

Turning to FIG. 5, in the through silicon vias TSV3, not the pads P1 and P2 located at the same plan position but the pads P1 and P2 located at different plan positions are connected by the though hole electrodes TH2. Although only three through silicon vias TSV3 are shown in FIG. 5, the through silicon vias TSV3 are provided in each of the core chips CC0 to CC7 by the number of core chips per signal (that is, eight). The eight through silicon vias TSV3 are connected cyclically as shown in FIG. 6. In FIG. 6, the front bumps 85 are shown by solid lines and the back bumps 84 are shown by broken lines. When the through silicon vias TSV3 are connected cyclically as shown in FIG. 6, different information can be supplied to each of the core chips CC0 to CC7 from the interface chip IF while the core chips CC0 to CC7 have the same circuit configuration. For example, when the internal circuit 6 is connected at the position of the back bump 84-7, signals supplied from the interface chip IF to the back bumps 84-0 to 84-7 of the lowermost core chip CC7 are selectively supplied to the internal circuits 6 of the core chips CC0 to CC7, respectively.

In this way, a signal path that is formed by cyclically connecting the through silicon vias TSV3 of the type shown in FIG. 2C is often referred to as "first signal path" in the present invention. In the first embodiment, eight first signal paths are formed and those first signal paths are allocated to the corresponding core chips CC0 to CC7, respectively. On the other hand, a signal path that is formed by the through silicon vias TSV1 of the type shown in FIG. 2A is often referred to as "second signal path". The second signal path is a signal path common to the core chips CC0 to CC7. Means for relieving the semiconductor device 10 from a defect occurring in one of the first signal paths are described in more detail.

Figure 7:
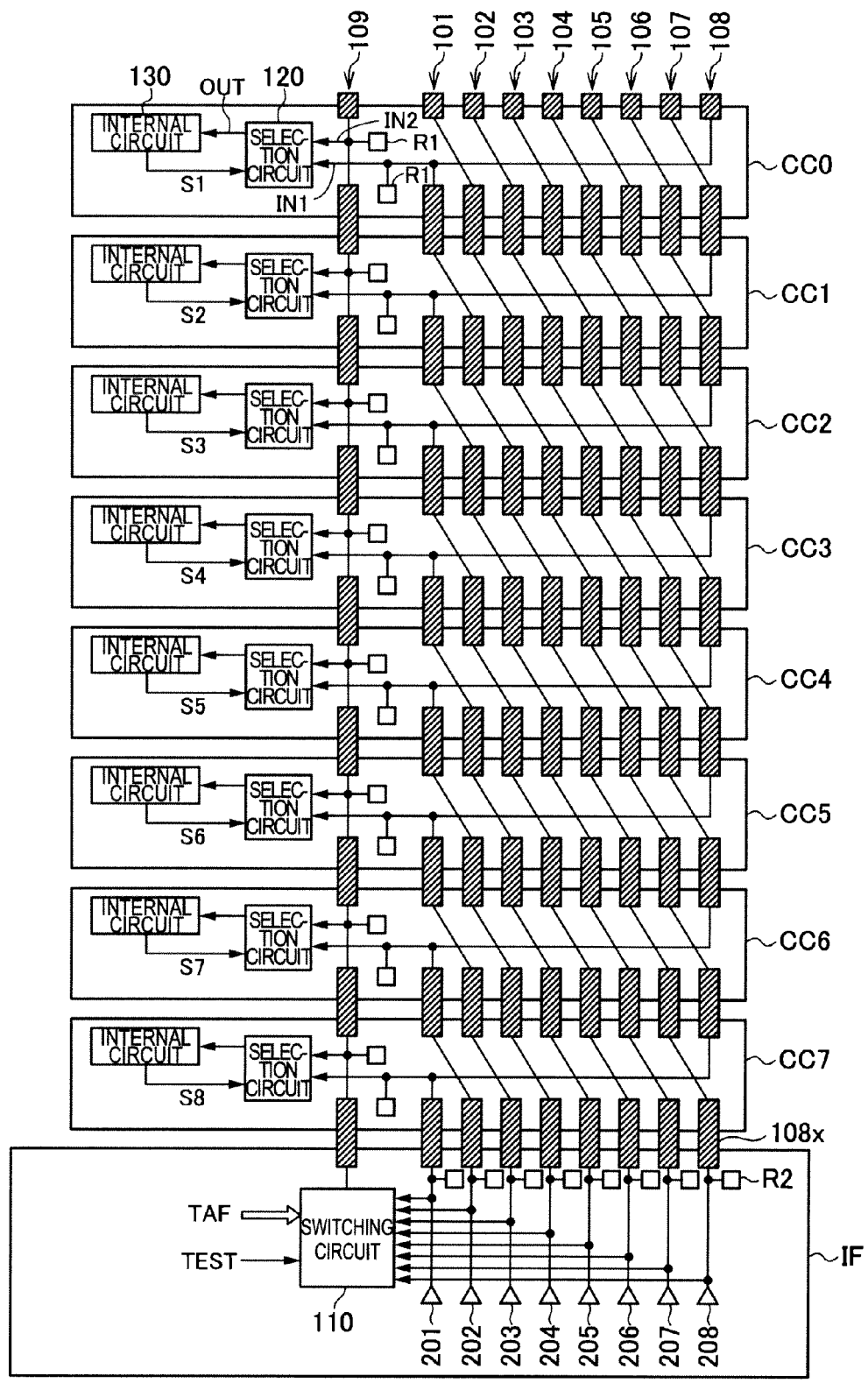
FIG. 7 is a schematic diagram for explaining the means for relieving the semiconductor device 10 from a defect occurring in one of the first signal paths, and shows elements related to transmission of signals from the interface IF to the core chips CC0 to CC7.

Turning to FIG. 7, the hatched elements shown on lower sides of the respective core chips CC0 to CC7 correspond to the through silicon vias TSV provided to penetrate through the core chips CC0 to CC7. Among these through silicon vias, eight through silicon vias 101 to 108 shown on the right of FIG. 7 and provided in each of the core chips CC0 to CC7 are the through silicon vias TSV3 of the type shown in FIG. 2C. One through silicon via 109 shown on the left of the through silicon vias 101 to 108 and provided in each of the core chips CC0 to CC7 is the through silicon via TSV1 of the type shown in FIG. 2A.

As shown in FIG. 7, the through silicon vias 101 to 108 provided in each of the core chips CC0 to CC7 are connected to the through silicon vias 108 and 101 to 107 provided in the upper core chip, respectively, and connected to the through silicon vias 102 to 108 and 101 provided in the lower core chip, respectively. The eight first signal paths described above are thereby formed. The through silicon vias 101 provided in the core chips CC0 to CC7 are connected to selection circuits 120 within the respective core chips CC0 to CC7. That is, the through silicon vias 101 correspond to the through silicon vias TSV3a shown in FIG. 2C, and are arranged on the same plane position as viewed from a stacking direction. With this configuration, output signals output from buffers 201 to 208 included in the interface chip IF are supplied to the selection circuits 120 included in the core chips CC0 to CC7 via the eight first signal paths allocated to the core chips CC0 to CC7, respectively.

Meanwhile, as shown in FIG. 7, the through silicon vias 109 provided in the core chips CC0 to CC7 match one another in plane position as viewed from the stacking direction. As described above, because the through silicon vias 109 correspond to the through silicon vias TSV1 of the type shown in FIG. 2A, the through silicon vias 109 provided in the respective core chips CC0 to CC7 are short-circuited to one another.

As a result, the through silicon vias 109 constitute the second signal path common to the core chips CC0 to CC7.

The second signal path constituted by the through silicon vias 109 is a signal path that replaces one first signal path constituted by the through silicon vias 101 to 108. A switching circuit 110 provided in the interface chip IF and the selection circuits 120 provided in the respective core chips CC0 to CC7 perform a replacing operation.

The switching circuit 110 is a circuit that selects one of the signals output from the buffers 201 to 208 and that switches whether the selected signal is output to the second signal path. The switching circuit 110 selects one of the signals output from the buffers 201 to 208 in response to a selection signal TAF, and switches whether the selected signal is output to the second signal path in response to a test signal TEST.

Figure 8:
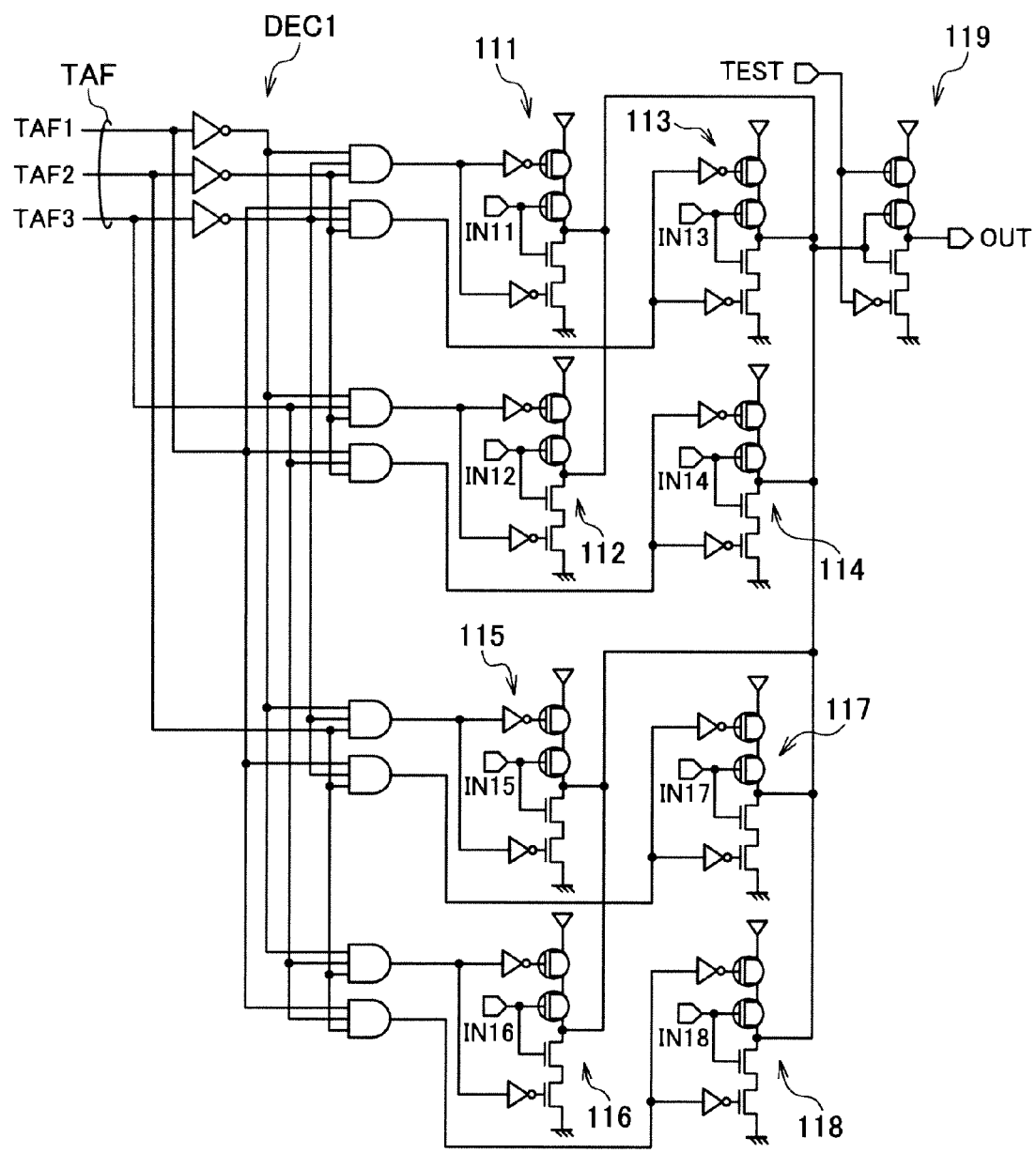
FIG. 8 is a circuit diagram indicative of an embodiment of a switching circuit 110.

Turning to FIG. 8, the switching circuit 110 is configured to include a decoder circuit DEC1 and tri-state inverters 111 to 119. The decoder circuit DEC1 decodes signals TAF1 to TAF3 of three bits that constitute the selection signal TAF, and thereby activates one of the eight tri-state inverters 111 to 118. Signals IN11 to IN18 output from the buffers 201 to 208 are supplied to input nodes of the tri-state inverters 111 to 118, respectively. Output nodes of the tri-state inverters 111 to 118 are short-circuited and connected to an input node of the tri-state inverter 119. An output node of the tri-state inverter 119 is connected to the second signal path, and changes into a high impedance state when the test signal TEST is activated to a high level.

With the above configuration, when the test signal TEST is deactivated to a low level, one of the signals IN11 to IN18 is output to the second signal path. A state in which the test signal TEST is deactivated to a low level represents a state during a normal operation. The selection signal TAF is held in a fuse circuit (not shown) included in the interface chip IF and supplied from the fuse circuit in response to the power being turned on.

On the other hand, the selection circuit 120 provided in each of the core chips CC0 to CC7 is the circuit that selects one of the first signal path allocated to the core chip and the second signal path as a signal path via which signals are input to the core chip. The selection circuit 120 selects the first or second signal path in response to the corresponding selection signals S1 to S8. Only one of the selection signals S1 to S8 is activated at the most and the activation of the two or more selection signals is prohibited. Note that the selection signals S1 to S8 are equivalent to a decoding result of decoding the selection signal TAF.

Figure 9:
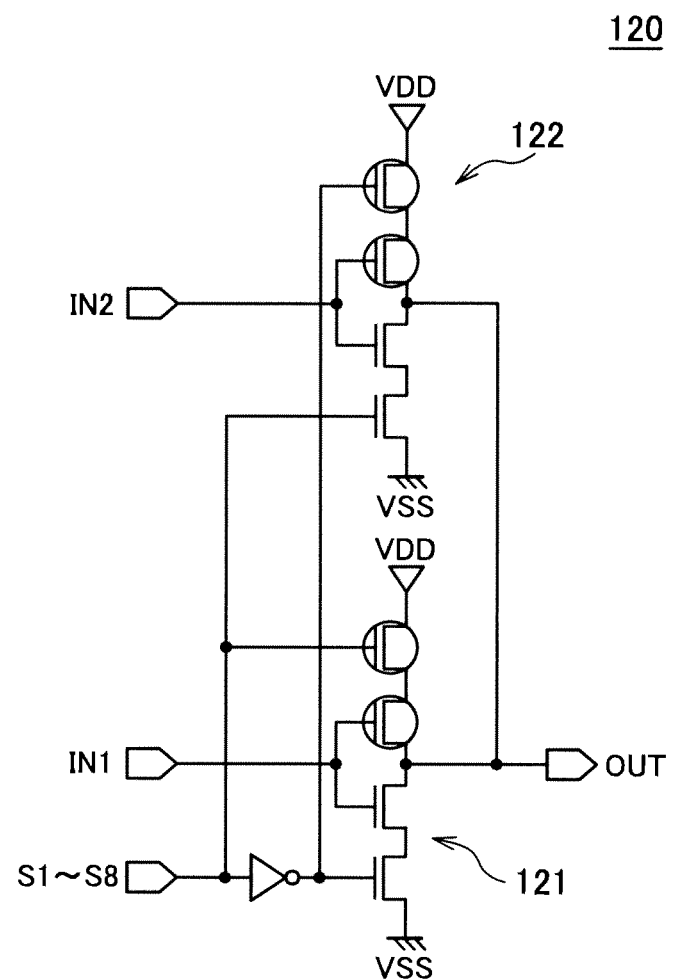
FIG. 9 is a circuit diagram indicative of an embodiment of a selection circuit 120.

Turning to FIG. 9, the selection circuit 120 is configured to include two tri-state inverters 121 and 122. As for these tri-state inverters 121 and 122, a signal IN1 from the first signal path is supplied to an input node of the tri-state inverter 121, and a signal IN2 from the second signal path is supplied to an input node of the tri-state inverter 122. Output nodes of the tri-state inverters 121 and 122 are short-circuited, and a signal OUT output from a short-circuited node is supplied to an internal circuit 130 shown in FIG. 7. Because one of these tri-state inverters 121 and 122 is activated in response to the corresponding selection signals S1 to S8, one of the signal IN1 supplied via the first signal path and the signal IN2 supplied via the second signal path is supplied to the internal circuit 130.

The selection signals S1 to S8 are held in a fuse circuit (not shown) included in the interface chip IF, and transferred to the respective core chips CC0 to CC7 via the other through silicon vias TSV (not shown) from the fuse circuit in response to the power being turned on. As described above, the selection signals S1 to S8 match the decoding result of decoding the selection signal TAF. Therefore, a common fuse circuit can be used to hold both the selection signal TAF and the selection signals S1 to S8.

As described above, even if one of the first signal paths is defective, specific signals to be supplied to the corresponding core chip can be correctly supplied to the core chip by replacing the defective first signal path by the second signal path. As an example, when a through silicon via 108x shown in FIG. 7 is defective, the first signal path allocated to the core chip CC0 is defective. In this case, in the interface chip IF, the tri-state inverter 111 is selected, thereby supplying the signal IN11 output from the buffer 201 to the second signal path. In the core chip CC0, the selection signal S1 is activated to a high level, thereby selecting the second signal path. The specific signals to be supplied from the interface chip IF to the core chip CC0 are supplied to the core chip CC0 not via the first signal path but via the second signal path.

Figure 10:
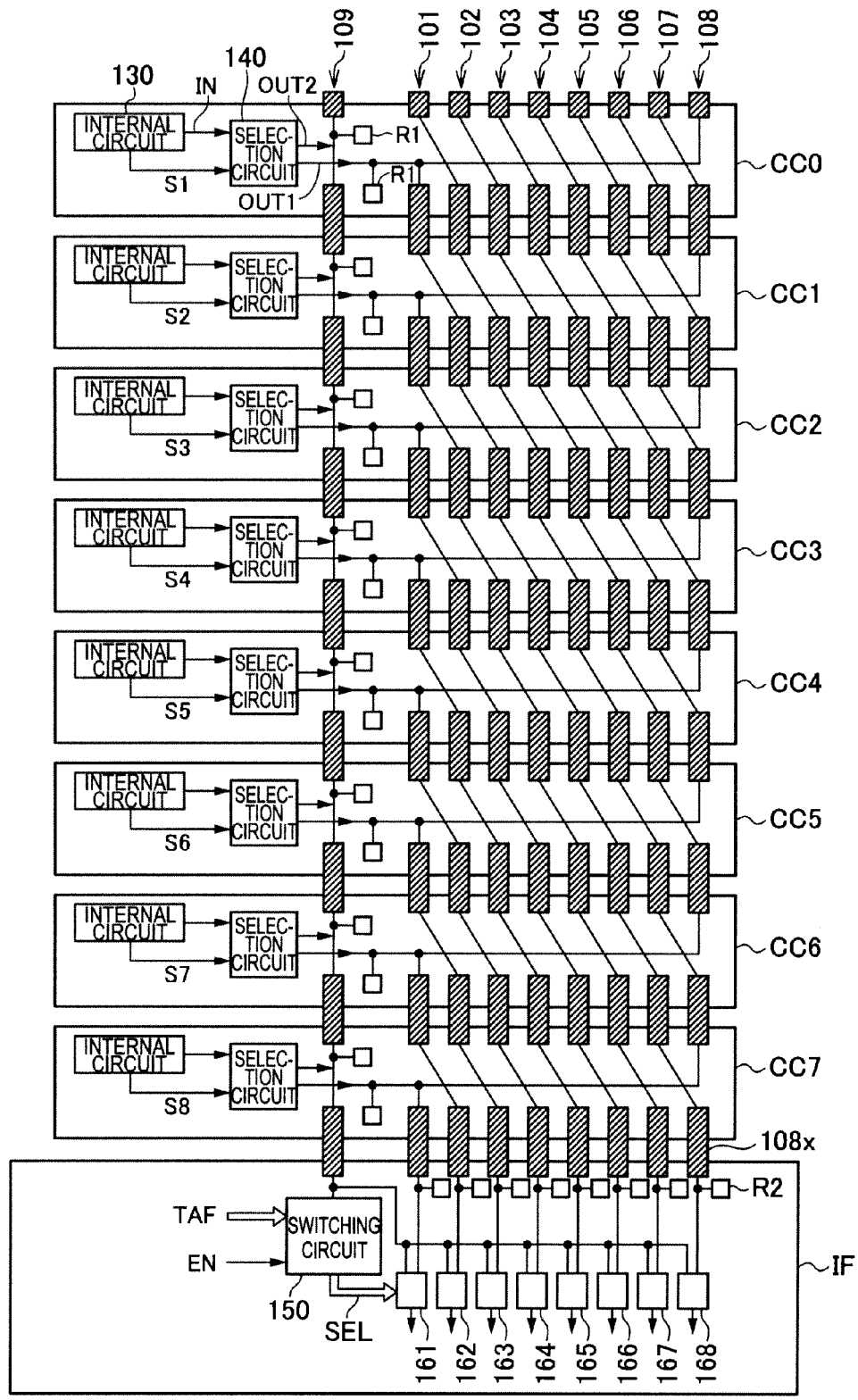
FIG. 10 is a schematic diagram for explaining means for relieving the semiconductor device 10 from a defect occurring in one of the first signal paths, and shows elements related to the transmission of signals from the core chips CC0 to CC7 to the interface chip IF.

In FIG. 10, like elements as those shown in FIG. 7 are denoted by like reference characters and redundant explanations thereof will be omitted. As shown in FIG. 10, selection circuits 140 provided in the respective core chips CC0 to CC7 and a switching circuit 150 and selection circuits 161 to 168 provided in the interface chip IF perform a replacing operation for replacing one of the first signal paths by the second signal path.

The selection circuit 140 provided in each of the core chips CC0 to CC7 is the circuit that selects one of the first signal path allocated to the core chip and the second signal path as a signal path via which signals are output from the core chip. The selection circuit 140 selects the first or second signal path in response to the corresponding selection signals S1 to S8.

Figure 11:
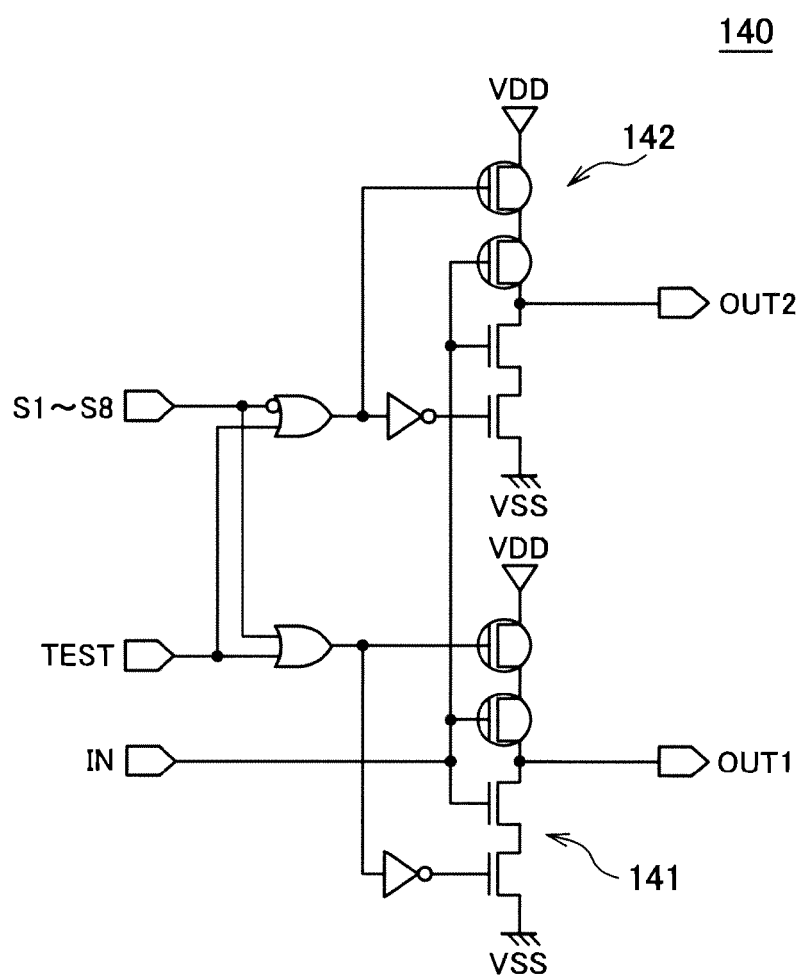
FIG. 11 is a circuit diagram of indicative of an embodiment of the selection circuit 140.

Turning to FIG. 11, the selection circuit 140 is configured to include two tri-state inverters 141 and 142. A signal IN supplied from the internal circuit 130 is commonly supplied to input nodes of the tri-state inverters 141 and 142. One of the tri-state inverters 141 and 142 is activated in response to the corresponding selection signals S1 to S8, and both of the tri-state inverters 141 and 142 are deactivated when the test signal TEST is activated to a high level. An output node of the tri-state inverter 141 is connected to the first signal path, and an output node of the tri-state inverter 142 is connected to the second signal path.

With this configuration, when the test signal TEST is deactivated to a low level, the signal IN supplied from the internal circuit 130 is output to one of the first and second signal paths based on a logic level of the corresponding selection signals S1 to S8. On the other hand, when the test signal TEST is activated to a high level, an output from the selection circuit 140 changes into a high impedance state.

Meanwhile, the switching circuit 150 is the circuit that selects one of the selection circuits 161 to 168 that is connected to the first signal path to be replaced by the second signal path. The switching circuit 150 selects one of the selection circuits 161 to 168 in response to the selection signal TAF.

Figure 12:
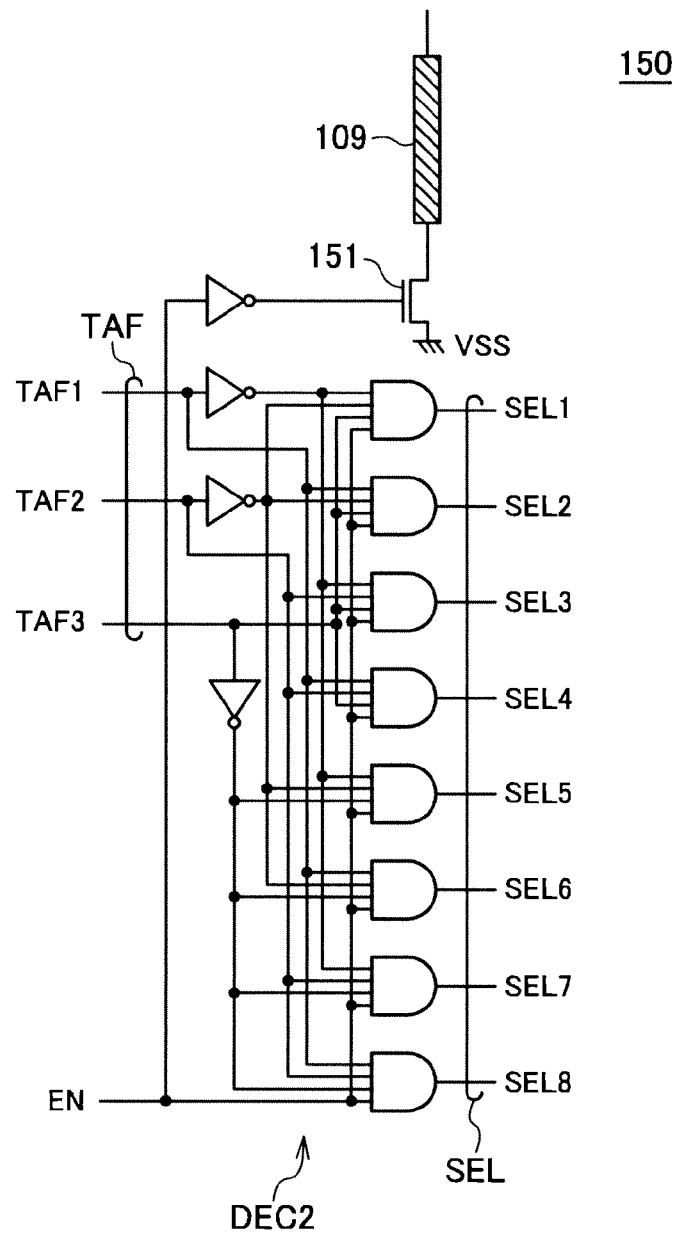
FIG. 12 is a circuit diagram of indicative of an embodiment of the switching circuit 150.

Turning to FIG. 12, the switching circuit 150 is configured to include a decoding circuit DEC2 that decodes the selection signal TAF, and a transistor 151 that applies a ground potential VSS to the through silicon via 109. The decoder circuit DEC2 decodes the signals TAF1 to TAF3 of three bits that constitute the selection signal TAF, and thereby activates one of eight switching signals SEL1 to SEL8 to a high level. These switching signals SEL1 to SEL8 are supplied to the eight selection circuits 161 to 168 shown in FIG. 10, respectively. The selection circuits 161 to 168 are identical in circuit configuration to the selection circuit 120 shown in FIG. 9. Each of the selection circuits 161 to 168 selects one of two input signals and outputs the selected signal. Each of the selection circuits 161 to 168 determines which signal is to be selected based on the corresponding switching signals SEL1 to SEL8.

The transistor 151 is connected between the through silicon via 109 that constitutes the second signal path and a ground wire, and an enable signal EN is supplied to a gate electrode of the transistor 151. The enable signal EN is a signal that becomes a high level when the first path is replaced by the second signal path, and that becomes a low level when the first path is not replaced by the second signal path. As a result, the transistor 151 is turned off when the first path is replaced by the second signal path, and is turned on when the first path is not replaced by the second signal path. This configuration can prevent the through silicon via 109 that constitutes the second signal path from changing into a floating state when the first path is not replaced by the second signal path.

With the above configuration, even if one of the first signal paths is defective, the specific signals output from each core chip can be correctly supplied to the interface chip IF by replacing this defective first signal path by the second signal path. As an example, when the through silicon via 108x shown in FIG. 10 is defective, the first signal path allocated to the core chip CC0 is defective. In this case, in the core chip CC0, the selection signal S1 is activated to a high level, thereby selecting the second signal path. In the interface chip IF, the switching signal SEL1 is activated to a high level, whereby the selection circuit 161 selects the second signal path. The specific signals to be supplied from the core chip CC0 to the interface chip IF are thereby supplied to the interface chip IF not via the first signal path but via the second signal path.

In FIGS. 7 and 10, elements denoted by reference characters R1 and R2 are test circuits for the through silicon vias 101 to 108. That is, after the semiconductor device 10 is manufactured, the through silicon vias 101 to 108 are tested using the test circuits R1 and R2. As a result, when a defect is found in any one of the through silicon vias 101 to 108, the corresponding first signal path is replaced by the second signal path, thereby relieving the semiconductor device 10.

Figure 13:
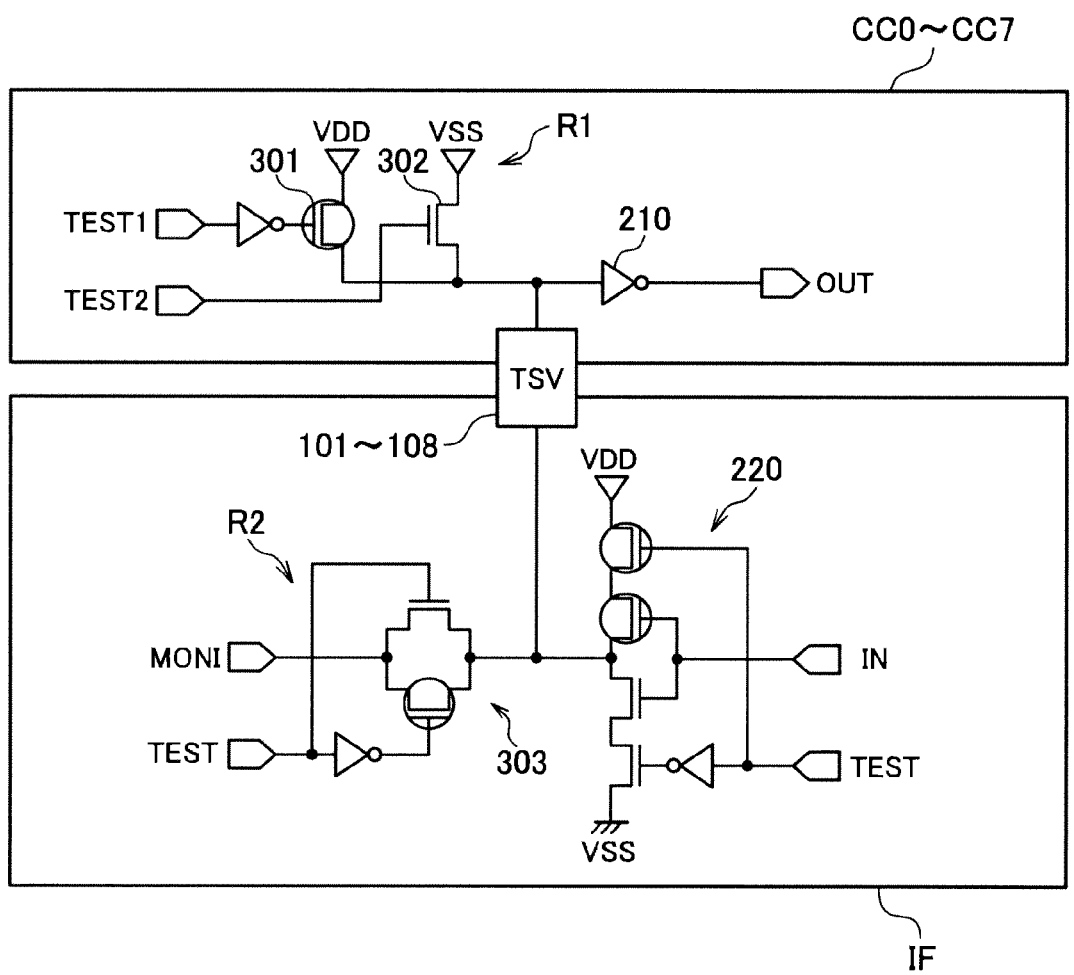
FIG. 13 is a circuit diagram of indicative of an embodiment of the test circuits R1 and R2.

Turning to FIG. 13, each test circuit R1 is provided in each of the core chips CC0 to CC7 and each test circuit R2 is provided in the interface chip IF. The test circuit R1 is the circuit that supplies a test potential to the corresponding through silicon vias 101 to 108, and the test circuit R2 is the circuit that detects the test potential via the corresponding through silicon vias 101 to 108. However, each test circuit R1 can be provided in the interface chip IF and that each test circuit R2 can be provided in each of the core chips CC0 to CC7 conversely to the example shown in FIG. 13.

The test circuit R1 is configured to include a transistor 301 that is connected between a power supply wire and the through silicon vias 101 to 108, and a transistor 302 that is connected between a ground wire and the through silicon vias 101 to 108. Test signals TEST1 and TEST2 are supplied to gate electrodes of the transistors 301 and 302, respectively. Accordingly, when the test signal TEST1 is activated to a high level, a power supply potential VDD is applied to the corresponding through silicon vias 101 to 108 as the test potential. When the test signal TEST2 is activated to a high level, the ground potential VSS is applied to the corresponding through silicon vias 101 to 108 as the test potential. During a normal operation, the test signals TEST1 and TEST2 are both at a low level, whereby the test circuit R1 is in a high impedance state as viewed from the through silicon vias 101 to 108. As a result, the test circuit R1 has no influence on a buffer circuit 210 during the normal operation.

The test circuit R2 is configured to include a transfer gate 303 that is connected between a monitor terminal MONI and the through silicon vias 101 to 108. When the test signal TEST is activated to a high level, the transfer gate 303 becomes conductive to connect the monitor terminal MONI to the through silicon vias 101 to 108. Furthermore, the test signal TEST is also supplied to a tri-state inverter 220 that is used during a normal operation. During a test operation during which this test signal TEST is at a high level, an output node of the tri-state inverter 220 is in a high impedance state. Because of this high impedance state, during the test operation, the tri-state inverter 220 has no influence on the test circuit R2. On the other hand, during the normal operation, the transfer gate 303 has no influence on the test circuit R2 because the transfer gate 303 is in the high impedance state.

During the test operation, the test signals TEST1 and TEST2 are sequentially activated to a high level in a state of activating the test signal TEST to a high level. For example, when the test signals TEST1 and TEST2 are activated in this order, the power supply potential VDD and the ground potential VSS are supposed to appear on the monitor terminal MONI in this order unless a defect occurs in any of the corresponding through silicon vias. On the other hand, if levels that appear on the monitor terminal MONI differ from those described above, there is a probability that a non-conductive defect or a short-circuit defect (short-circuit to the power supply line or the other through silicon via) occurs in any of the corresponding through silicon vias.

When such a defect is found, information on the defect is programmed in the fuse circuit included in the interface chip IF so as to replace the first signal path constituted by the through silicon vias that include the defective through silicon via by the second signal path. Accordingly, when the semiconductor device 10 is actually used, the selection signal TAF and the selection signals S1 to S8 are output from the fuse circuit in response to the power being turned on, and the first signal path including the defect is correctly replaced by the second signal path.

As described above, according to the first embodiment, even if one of the first signal paths is defective, the semiconductor device 10 can be relieved by replacing this defective first signal path by the second signal path. It is also possible to improve the production yield because the semiconductor device 10 can be relieved whether the defect is a non-conductive defect or a short-circuit defect. Furthermore, in the first embodiment, it suffices to use a small number of through silicon vias 109 necessary for the relief and there is no need to provide a switching circuit to correspond to each through silicon via, and thus it is possible to suppress the increase in an occupation area of the through silicon vias on each of chips.

Figure 14:
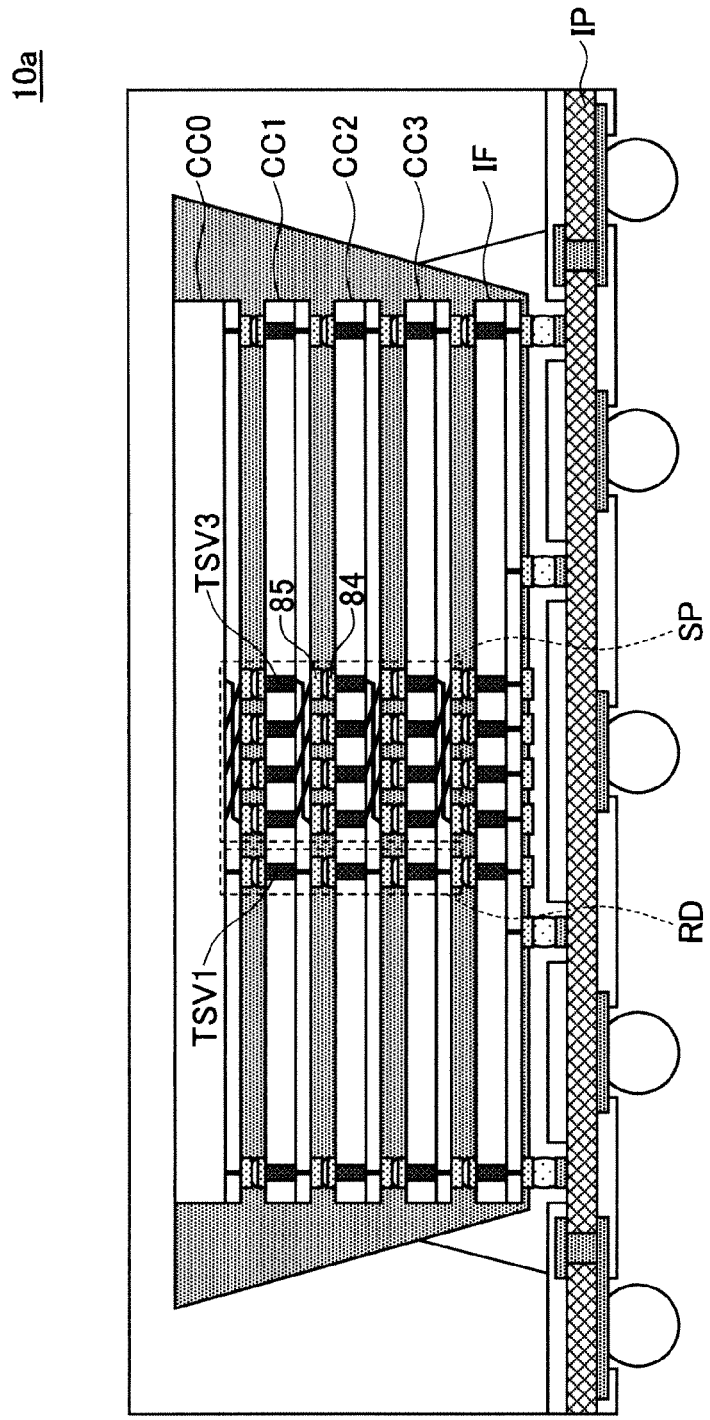
FIG. 14 is a cross-sectional pattern diagram for explaining a semiconductor device 10a according to a second embodiment of the present invention.

Turning to FIG. 14, the semiconductor device 10a according to the second embodiment is constituted to stack the four core chips CC0 to CC3 including identical functions and manufactured by the use of the same manufacturing mask, one interface chip IF manufactured by the use of a manufacturing mask different from the manufacturing mask for the core chips CC0 to CC3, and one interposer IP. The core chips CC0 to CC3 and the interface chip IF are semiconductor chips using the silicon substrate, and stacked on the interposer IP in a face-down manner. The face-down manner is a manner of mounting semiconductor chips so that principal surfaces of the semiconductor chips on which electronic circuits such as transistors are formed face down, that is, so that the principal surfaces face the interposer IP.

However, the semiconductor device according to the present invention is not limited to the face down manner but the respective semiconductor chips can be stacked in a face-up manner. The face-up manner is a manner of mounting semiconductor chips so that the principal surfaces of the semiconductor chips on which electronic circuits such as transistors are formed face up, that is, so that the principal surfaces face a side opposite to the interposer IP. Alternatively, a mixture of semiconductor chips stacked in the face-down manner and those stacked in the face-up manner can be mounted.

Among these semiconductor chips, many through silicon vias TSV that penetrate through the silicon substrate are provided in the core chips CC1 to CC3 and the interface chip IF but not provided in the core chip CC0 located on an uppermost layer. The surface bumps 85 are provided on the principal surface of each chip at a position at which the front surface bumps 85 overlap the through silicon vias TSV in a plan view as viewed from the stacking direction, and the rear surface bumps 84 are provided on the rear surface of the chip. The rear surface bumps 84 of the semiconductor chip located on a lower layer contact the front surface bumps 85 of the semiconductor chip located on an upper layer. The semiconductor chips adjacent vertically are thereby electrically connected to one another.

In the second embodiment, the through silicon vias TSV are not provided in the core chip CC0 on the uppermost layer because the chips are stacked in the face-down manner, and therefore it is unnecessary to form bump electrodes on the rear surface of the core chip CC0. If the through silicon vias TSV are not provided in the core chip CC0 on the uppermost layer as described above, the core chip CC0 on the uppermost layer can be made thicker than the other core chips CC1 to CC3. Accordingly, this configuration can reduce warpage of the chip that tends to occur on the uppermost layer and can intensify mechanical strength. Furthermore, this configuration can simplify a step of making the core chip CC0 thin. However, in the present invention, the through silicon vias TSV can be provided in the core chip CC0 on the uppermost layer. In this case, it is possible to manufacture all of the core chips CC0 to CC3 in the same steps.

Also in the second embodiment, the through silicon vias TSV1 and TSV3 having the structures shown in FIGS. 2A and 2C are provided in the core chips CC1 to CC3. Although no through silicon vias are provided in the core chip CC0, each of the front surface bumps 85 of the core chip CC0 provided at the same position as those of the through silicon vias TSV3 of the core chips CC1 to CC3 in the plan view is connected to the pads P0 and P1 provided at the different positions in the plan view, similarly to the structure shown in FIG. 5. Signal paths SP shown in FIG. 14 thereby function to independently connect the core chips CC0 to CC3 to the interface chip IF by the cyclical connection, respectively, similarly to the first signal paths (the through silicon vias 101 to 108) shown in FIGS. 7 and 10. On the other hand, each of the front surface bumps 85 of the core chip CC0 provided at the same position as those of the through silicon vias TSV1 of the core chips CC1 to CC3 in the plan view is connected to the pads P0 to P3 provided at the different positions in the plan view, similarly to the structure shown in FIG. 3. A signal path RD shown in FIG. 14 thereby functions similarly to the second signal path (the through silicon via 109) shown in FIGS. 7 and 10.

Therefore, in the second embodiment, similarly to the first embodiment described above, even if a defect occurs in a part of the signal paths SP, the defective signal path SP can be replaced by the signal path RD. In the second embodiment, the signals TAF1 and TAF2 of two bits constitute the selection signal TAF for selecting one of the core chips CC0 to CC3 because the number of the core chips is four, that is, the core chips are CC0 to CC3. Furthermore, differently from the first embodiment, the four buffers 201 to 204 are used in place of the eight buffers 201 to 208 shown in FIG. 7. Furthermore, the four selection circuits 161 to 164 are used in place of the eight selection circuits 161 to 164 shown in FIG. 10. The second embodiment is described in more detail below.

Figure 15:
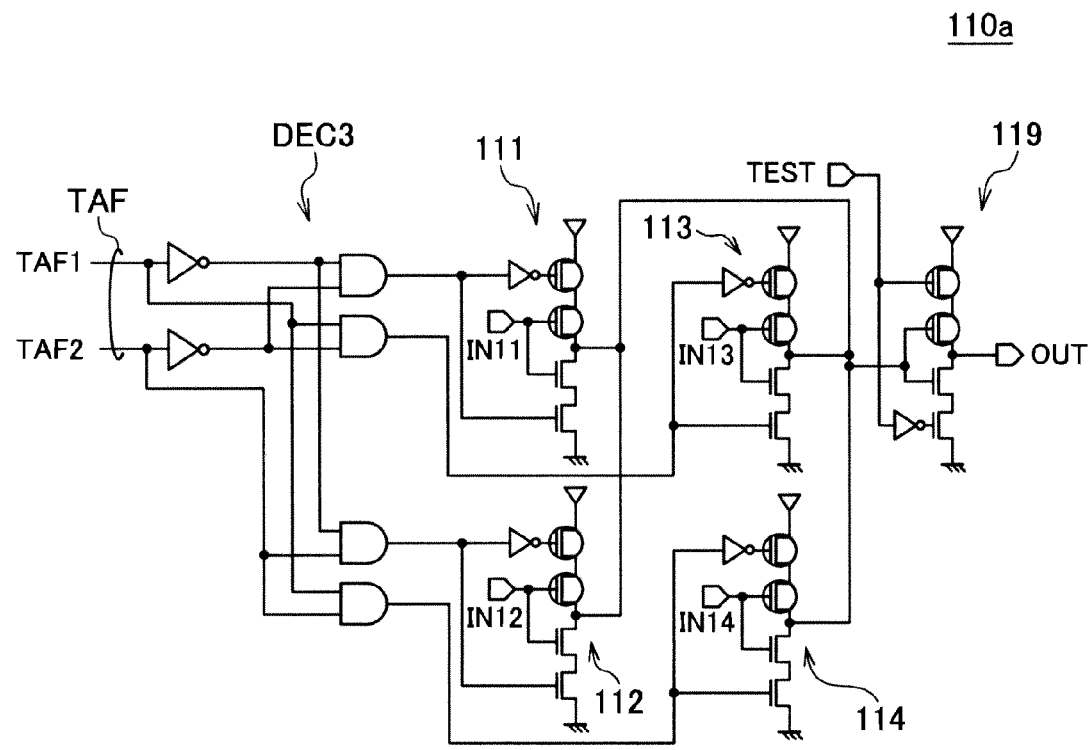

Turning to FIG. 15, the switching circuit 110a used in the second embodiment is configured to include a decoder circuit DEC3 and tri-state inverters 111 to 114. The decoder circuit DEC3 decodes signals TAF1 and TAF2 of two bits that constitute the selection signal TAF, and thereby activates one of the four tri-state inverters 111 to 114. Signals IN11 to IN14 output from the buffers 201 to 204 are supplied to input nodes of the tri-state inverters 111 to 114, respectively. Output nodes of the tri-state inverters 111 to 114 are short-circuited and connected to an input node of the tri-state inverter 119. An output node of the tri-state inverter 119 is connected to the signal path RD, and changes into a high impedance state when the test signal TEST is activated to a high level. With this configuration, the switching circuit 110a performs the same operation as the switching circuit 110 shown in FIG. 8.

Similar circuits to the circuits shown in FIGS. 9 and 11 can be used as the selection circuits 120 and 140, respectively, except for using the selection signals S1 to S4 instead of the selection signal S1 to S8.

Figure 16:
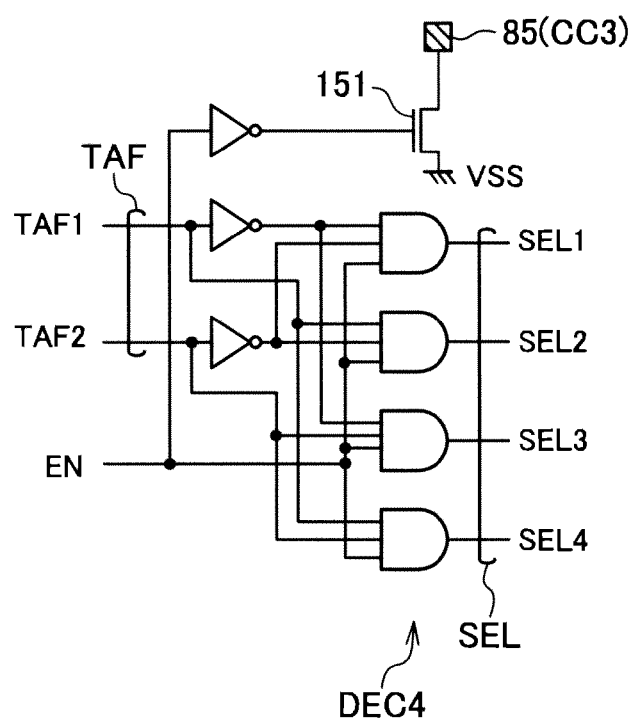

Turning to FIG. 16, the switching circuit 150a used in the second embodiment is configured to include a decoding circuit DEC4 that decodes the selection signal TAF, and a transistor 151 that applies a ground potential VSS to the front surface bumps 85 of the core chip CC3. An enable signal EN is supplied to the gate electrode of the transistor 151. The decoder circuit DEC4 decodes the signals TAF1 and TAF2 of two bits that constitute the selection signal TAF, and thereby activates one of four switching signals SEL1 to SEL4 to a high level.

As described above, even if one of the first signal paths SP is defective, specific signals to be supplied to the corresponding core chip can be correctly supplied to the core chip by replacing the defective signal path SP by the signal path RD. Further, even if one of the first signal paths SP is defective, specific signals to be output from the corresponding core chip can be correctly supplied to the interface chip IF by replacing the defective signal path SP by the signal path RD.

It is apparent that the present invention is not limited to the above embodiments, but may be modified and changed without departing from the scope and spirit of the invention.

For instance, in the above embodiments, the semiconductor device 10 or 10a constituted to stack the interface chip IF and the core chips CC0 to CC7 or CC0 to CC3 has been described as an example. However, the present invention is also applicable to any semiconductor device as long as the semiconductor device is configured to include a first semiconductor chip and a plurality of stacked second semiconductor chips. That is, in the above embodiments, the interface chip IF corresponds to the first semiconductor chip and the core chips CC0 to CC7 or CC0 to CC3 correspond to the second semiconductor chips, respectively.

Furthermore, in the embodiments described above, the eight core chips CC0 to CC7 or the four core chips CC0 to CC3 are stacked on the interface chip IF. However, the number of stacked second semiconductor chips is not limited thereto. If the number of stacked second semiconductor chips increases, the number of through silicon vias that constitute the first signal path increases. Therefore, the effects of the present invention are more significant when the number of stacked second semiconductor chips is larger.

What is claimed is:

1. A semiconductor device comprising:
   a first circuit formed on a first chip having a main surface;
   first to $n^{th}$ penetration electrodes penetrating through the first chip, where n is an integer more than 1;
   first to $n^{th}$ main terminals arranged on the main surface of the first chip and vertically aligned with the first to $n^{th}$ penetration electrodes, respectively, each of $k^{th}$ main terminal being electrically connected to $k+1^{th}$ penetration electrode and not being electrically connected to a kth penetration electrode, where k is an integer more than 0 and smaller than n, and the $n^{th}$ main terminal being electrically connected to the first penetration electrode and not being electrically connected to the nth penetration electrode;
   a sub-terminal arranged on the main surface of the first chip; and
   a selection circuit electrically connected to predetermined one of the first to $n^{th}$ main terminals, the sub-terminal, and the first circuit, wherein the selection circuit connects the first circuit to one of the predetermined main terminal and the sub-terminal.

2. The semiconductor device as claimed in claim 1, further comprising a second chip, wherein the second chip includes:
   first to $n^{th}$ main control terminals electrically connected to the first to $n^{th}$ main terminals of the first chip, respectively;
   first to $n^{th}$ second circuits electrically connected to the first to $n^{th}$ main control terminals, respectively;
   a sub-control terminal electrically connected to the sub-terminal of the first chip; and
   a switching circuit electrically connecting any one of the first to $n^{th}$ second circuits to the sub-control terminal.

3. The semiconductor device as claimed in claim 2, wherein a plurality of the first chips are stacked to one another, and the first to $n^{th}$ penetration electrodes provided in one of the first chips being electrically connected to the first to $n^{th}$ main terminals provided in another one of the first chips arranged adjacent to the one of the first chip, respectively, such that a plurality of first signal paths each connected between the second chip and an associated one of the first chips are provided.

4. The semiconductor device as claimed in claim 3, further comprising auxiliary penetration electrodes each penetrating through an associated one of the first chips,
   wherein each of the auxiliary penetration electrodes is vertically aligned with and electrically connected to the sub-terminal arranged on the main surface of respective one of the first chips, such that a second signal path connected between the second chip and the first chips in common is provided.

5. The semiconductor device as claimed in claim 4, wherein, the predetermined ones of the first to $n^{th}$ main terminals provided in the first chips are vertically aligned.

6. The semiconductor device as claimed in claim 5, wherein the switching circuit includes a first switching circuit that supplies one of a plurality of input signals received from the second circuits to the second signal path.

7. The semiconductor device as claimed in claim 6, wherein the selection circuit provided in each of the first chips includes a first selection circuit that supplies the input signal received from an associated one of the first signal paths or the input signal received from the second signal path to the first circuit.

8. The semiconductor device as claimed in claim 7, wherein the selection circuit provided in each of the first chips further includes a second selection circuit that supplies an output signal received from the first circuit to the associated of the first signal paths or the second signal path.

9. The semiconductor device as claimed in claim 8, wherein the switching circuit further includes a second switching circuit that supplies the output signal received from the second signal path to selected one of the second circuits.

10. The semiconductor device as claimed in claim 9, wherein the second signal path is supplied with a predetermined potential when the second switching circuit is inactivated.

11. The semiconductor device as claimed in claim 3, wherein
    one of the first chips and the second chip includes a first test circuit that supplies a test potential to the first to $n^{th}$ penetration electrodes, and
    the other one of the first chips and the second chip includes a second test circuit that detects the test potential via the first to $n^{th}$ penetration electrodes.

12. The semiconductor device as claimed in claim 11, wherein the first and second test circuits are in a high impedance state with respect to the first to $n^{th}$ penetration electrodes during a normal operation.

13. A semiconductor device comprising:
    a first semiconductor chip having a first penetration electrode;
    a plurality of second semiconductor chips that are stacked on one another, each of the second semiconductor chips having a plurality of first penetration electrodes and a second penetration electrode penetrating therethrough;
    a plurality of first signal paths each connecting a first penetration electrode of the first semiconductor chip to a first penetration electrode of a respective different one of the second semiconductor chips, wherein the first penetration electrode of the respective different one of the second semiconductor chips is not vertically aligned with the first penetration electrode of the first semiconductor chip, each of first signal paths being formed by respective ones of the first penetration electrodes;
    a second signal path connecting the first semiconductor chip to the second semiconductor chips in common, the second signal path being formed by the second penetration electrodes; and
    a switching circuit that replaces one of the first signal paths by the second signal path.

14. The semiconductor device as claimed in claim 13, further comprising:
    a third semiconductor chip stacked on the second semiconductor chips such that the second semiconductor chips are sandwiched between the first and third semiconductor chips; and
    a third signal path connecting the first semiconductor chip to the third semiconductor chip, the third signal path being formed by respective ones of the first penetration electrodes, wherein
    the second signal path connects the first semiconductor chip to the second and third semiconductor chips in common, and
    the switching circuit replaces one of the first and third signal paths by the second signal path.

15. The semiconductor device as claimed in claim 14, wherein the third semiconductor chip is free from penetration electrodes.

16. The semiconductor device as claimed in claim 15, wherein the third semiconductor chip has substantially the same function as the second semiconductor chips.

17. The semiconductor device as claimed in claim 16, wherein the third semiconductor chip is thicker than each of the second semiconductor chips.

* * * * *